United States Patent [19]

Stoutenburg

[11] 4,312,232
[45] Jan. 26, 1982

[54] VIBRATION ANALYZER WITH DIGITAL READOUT

[75] Inventor: Donn V. Stoutenburg, Westerville, Ohio

[73] Assignee: IRD Mechanalysis, Inc., Columbus, Ohio

[21] Appl. No.: 173,808

[22] Filed: Jul. 30, 1980

Related U.S. Application Data

[63] Continuation-in-part of Ser. No. 76,029, Sep. 17, 1979, abandoned.

[51] Int. Cl.³ ............................ G01H 3/12; H03H 7/12
[52] U.S. Cl. ........................................ 73/659; 73/462; 333/17 R
[58] Field of Search ............... 73/659, 658, 660, 462; 333/17 R, 173; 328/167

[56] References Cited

U.S. PATENT DOCUMENTS

| | | | |
|---|---|---|---|
| 2,976,408 | 3/1961 | Colaguori | 333/17 R |
| 3,293,572 | 12/1966 | Smith | 333/17 R |
| 3,475,702 | 10/1969 | Ainsworth | 333/17 R |
| 3,588,752 | 6/1971 | Hirshfield | 333/17 R |
| 3,668,566 | 6/1972 | Trigg | 333/17 R |
| 4,010,637 | 3/1977 | Harwell et al. | 73/658 |
| 4,257,018 | 3/1981 | Masdea et al. | 333/17 R |

*Primary Examiner*—Stephen A. Kreitman
*Attorney, Agent, or Firm*—Mueller and Smith

[57] ABSTRACT

A system for carrying out vibrational analysis of machinery and the like wherein a voltage controlled filter is combined with a phase-locked feedback loop to detect maximum amplitude within a given frequency band. A simply derived readout of frequency and amplitude is made available with the arrangement and operation over three or more decades of frequency is availed without manual switching and the like.

15 Claims, 2 Drawing Figures

VIBRATION ANALYZER WITH DIGITAL READOUT

RELATED APPLICATION

This application is a continuation-in-part of U.S. application Ser. No. 76,029, filed Sept. 17, 1979, now abandoned.

BACKGROUND OF THE INVENTION

While not limited thereto, the present invention is particularly adapted for use with electronic balancing apparatus for rotating bodies and the like. Vibration analyzing apparatus of this type must be capable of measuring the magnitude, frequency and phase of vibration caused by a rotating body. Furthermore, when there are two or more sources of vibration in a piece of equipment to be balanced, as is quite often the case, the analyzing equipment must be capable of separating a particular frequency associated with a single vibrating part from all other frequencies in order to effect a balancing or corrective operation.

In order to sense mechanical vibrations, the analyzing apparatus utilizes a vibration responding transducer which transforms the vibrations into an electrical signal having a frequency equal to that of the vibrations, an amplitude proportional to the magnitude of the vibrations, and a phase displacement relative to a reference signal which is related to the location of a point of unbalance on a rotating body. The resulting vibration signal is then applied to apparatus including an amplitude meter for indicating the level (amplitude) of the vibrations, a frequency meter for indicating the signal frequency, a filter to separate selected frequencies of vibration for individual measurement, and a phase determining means such as a phase indicator or strobe light.

Generally in the past, an operator assigned the task of carrying out an on-site vibration analysis of an industrial machine has been provided one or more portable devices constituting the above apparatus. Upon connecting the apparatus with the vibration responding transducer, a knob or dial having indicia associated therewith corresponding with a predetermined range of frequencies was manipulated to alter the frequency response of the apparatus to detect vibrational frequencies which corresponded with relatively high vibrational amplitudes, such higher amplitude generally being associated with a frequency representing a potential machine defect. Detection of such a peak amplitude generally was achieved by observing the noted amplitude meter which was present as a conventional analog-type having a dial and associated scale. A conventional, analog-type frequency meter with associated dial and scale then was read to determine, as closely as possible, the frequency at which that peak vibrational amplitude occurred. The experience of the industry has shown that such frequencies represent a highly important criterion for analyzing actual or impending machine defects. Accordingly, the accuracy of such frequency reading and its proper correlation to a genuine amplitude has been considered important to proper machine analysis.

In seeking to find significant peak amplitudes utilizing the analyzing apparatus, the operator generally turns to two approaches. If a pre-existing awareness of critical frequency regions is available, the operator turns the frequency selection knob directly to those regions and manipulates or "rocks" it while simultaneously observing the amplitude readout. Alternately, where no such preconceived awareness is present, the operator "scans" across the spectrum of frequencies available from the transducer derived vibrational signal while recording frequencies corresponding with all observed peak amplitude vibration signals.

The analyzing apparatus and associated techniques of use as thus described, while having been found to be quite effective, are not adequately precise to permit very high readout accuracies for deriving correspondingly more predictive defect identification. For example, the analog meters utilized for frequency and amplitude readout are inherently limited to precisions of about 1 or 2%. For many vibration analysis applications, such accuracies are inadequate. While digital readout devices are available in the market place having much higher capabilities for precision, e.g. better than 0.01%, their digital readout response or "update rate" is rapid to an extent wherein operators become confused as they manually manipulate the frequency tuning knob, the apparatus then having the attribute of being oversensitive to the extent of being impractical.

Conventional filters utilized in carrying out the above-described frequency spectrum scanning are tuned by manually varying the resistance, capacitance or inductance of selected filter elements. Such tuning approaches have been found to exhibit operational limitations. For example, varying a resistance parameter by means of a potentiometer poses frequency range or band limitations. To achieve adequate frequency scanning range, therefore, ganged potentiometer components in association with multi-range selection switching typically is resorted to. Thus, to carry out full vibrational frequency scanning, the operator has been called upon to perform a variety of manipulative tasks, a situation to be avoided in developing more effective tools for vibration analysis.

SUMMARY OF THE INVENTION

The present invention is addressed to a system for carrying out the vibrational analysis of apparatus exhibiting a dynamic characteristic wherein a more precise digital readout of vibrational parameters such as frequency and amplitude is provided in a manner avoiding the difficulties heretofore encountered with such readouts. The system utilizes a voltage-tuned filter in combination with a detector servo-loop network in a manner taking unique advantage of the characteristic of filters wherein a center frequency within a tuned bandwidth will correspond with peak amplitude under conditions of zero phase shift through the filter. Thus, operators of apparatus incorporating the system of the invention are called upon simply to activate the detector network upon observing an indication of peak amplitude in the course of general frequency spectrum scanning. Upon such activation, the apparatus automatically will derive a stable digital readout of both peak amplitude and its corresponding frequency.

As a further aspect and object of the invention, there is provided synchronous filter means comprising a voltage-tuned filter in which the passband frequency is varied as a function of an applied input tuning voltage. Means are provided for applying a signal to be filtered to the input of the filter together with means for comparing the phase of the input signal with the phase of the output signal from the filter to derive an error signal which varies as a function of the phase difference. Since the phase difference is a function of filter detuning, this error signal when integrated is utilized to vary the applied input tuning voltage to maintain the passband of the filter at a desired center frequency where the phase difference is zero.

Preferably, if the output of the filter is initially shifted in phase and then compared with the input signal, an error signal of sufficient magnitude and polarity is derived to effect a correction. The integrated error signal is summed with a desired primary tuning input control voltage derived from a manually-operated voltage source and applied to the tuning input of the voltage-tuned filter.

Another object of the invention is to provide a system for carrying out the vibrational analysis of apparatus having a dynamic characteristic where said system includes an input arrangement for receiving an a.c. input signal which corresponds to that dynamic characteristic, which input signal is asserted at the input of a voltage-tunable filter of variety wherein the passband center of frequency thereof is selectable as an exponential function of a tuning-input voltage applied at a tuning input thereof. An amplitude readout is coupled with the output of the filter for providing a visible indication of the instantaneous amplitude of signals filtered by the filter. A manually actuable voltage source also is provided for deriving a manually selectable primary tuning input voltage which is assertable at the filter tuning input. Detection then is provided for comparing the phase of the input signal with the phase of the filtered signal at the output of the filter to derive an error signal corresponding with a phase difference between those signals. This error signal is integrated and summed with the primary tuning input voltage at a summing arrangement and, a manually actuable switch is provided for selectively effecting the assertion of the error signal at the summing point in a manner wherein the magnitude of the error signal is minimized and the magnitude of the filtered signal is maximized.

The above and other objects and features of the invention will become apparent from the following detailed description taken in connection with the accompanying drawings which from a part of this specification.

DETAILED DESCRIPTION

Figure 1:
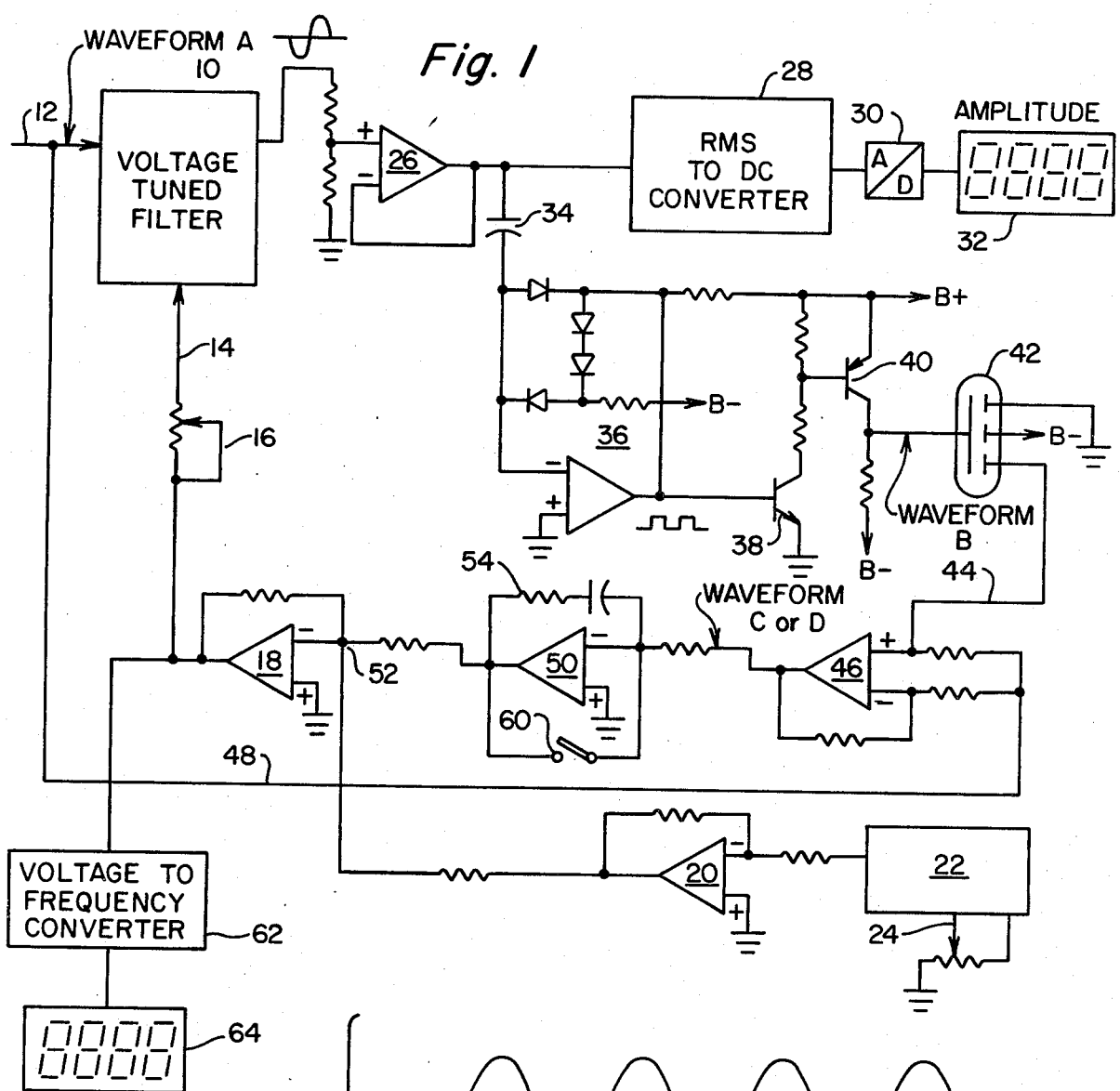
FIG. 1 is a schematic circuit diagram of apparatus incorporating the system of the invention.

With reference now to the drawings, and particularly to FIG. 1, there is shown a voltage-tuned filter 10 which may, for example, be of the type manufactured by D. B. Developments of Rome, N.Y., and which is described in application for U.S. patent, Ser. No. 78,076. The filter 10 has an input terminal or lead 12 to which alternating current signals which are to be filtered are applied. It also has a second tuning input terminal or lead 14 to which a voltage is applied, the magnitude of which is indicative of the desired center frequency of the filter 10. The lead 14 is connected through potentiometer 16 to operational amplifier 18. One of the inputs to the amplifier 18, in turn, is connected through inverter 20 to a voltage source 22, the magnitude of the output voltage from source 22 being typically controlled by potentiometer 24 or other means under the manual control of an operator. In the absence of a tuning correction signal from integrator 50, the voltage from source 22 thus establishes the desired tuning input voltage to the filter 10 and, hence, the desired passband center frequency of the filter. As will occur to those skilled in the art, an automatic voltage tuning arrangement may be provided in lieu of potentiometer 24 such that progressively increasing or decreasing voltage levels automatically may be asserted from source 22.

The output of the filter 10 is applied through operational amplifier 26 to a RMS-to-DC converter 28. In the case of a vibration input signal applied to lead 12, which is within the filter passband, the RMS-to-DC converter 28 produces a direct current output voltage which is proportional to the RMS value of the sine-wave vibration signal. This is applied to an analog-to-digital converter 30 which, in turn, has its output connected to a digital readout 32 which may, for example, be a liquid crystal display or a light-emitting diode display.

The filtered signal at the output of amplifier 26 is also applied through capacitor 34 to the input of a square-wave shaper 36. The action of capacitor 34 and square-wave shaper 36 is to generate a square wave which is shifted in phase by 90° from the output of voltage tuned filter 10. The square-wave output from the shaper 36 is applied to the base of transistor 38 which, in turn, drives transistor 40. The collector of transistor 40 is connected to the gate electrode of a field-effect transistor analog switch 42 having its drain electrode connected through lead 44 to the non-inverting input of operational amplifier 46. Also applied to both inputs of the operational amplifier 46 via lead 48 is the original, unfiltered signal on lead 12. The output of amplifier 46, in turn, is applied to an integrator 50, the integrator output or tuning correction signal being applied to summing point 52 where it is summed with the direct current voltage from source 22 closing the loop around voltage-tuned filter 10 via amplifier 18 and lead 14. Resistor 54, within the feedback path of integrator 50, serves to provide a form of lead compensation to enhance the stability of the phase-locked loop.

Figure 2:
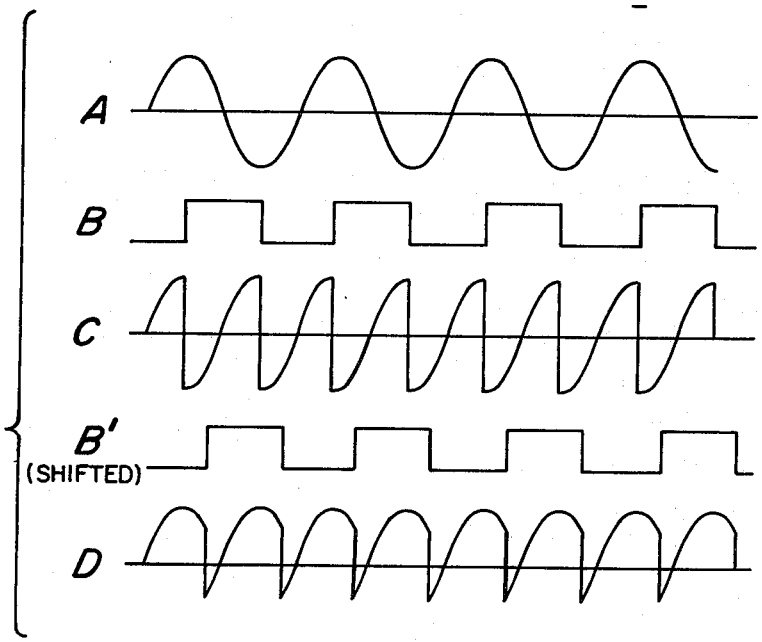
FIG. 2 comprises waveforms illustrating the operation of the circuitry of FIG. 1.

The operation of the circuit of FIG. 1 can best be understood by reference to FIG. 2 wherein waveform A comprises the unfiltered sine-wave signal on lead 12 and wave-form B comprises the square-wave output from shaper 36 which is shifted in phase by 90° with respect to the output of the voltage-tuned filter 10. The squarewave pulses in waveform B act to turn ON and OFF the analog switch 42 which, in turn, likewise causes operational amplifier 46 to operate alternately as an inverting and non-inverting unity gain amplifier. As a result, the signal appearing as waveform C in FIG. 2 will be present at the output of amplifier 46 for the stated 90° phase condition. The output of the inverting/non-inverting amplifier 46 is the error voltage which is given by the average value of waveform C. Waveform C is the product of the quadrature inverting/non-inverting square-wave and waveform A. Said error voltage waveform will have an average value of zero volts only when the phase of waveform B is 90° with respect to the component of interest of waveform A.

If the phase difference through the filter is non-zero, then the square wave B will be shifted with respect to A as shown at B, and waveform C will be changed in shape to resemble, as an example, waveform D. This error voltage waveform has a non-zero average value and is indicative of the phase shift of the signal through the filter. This phase shift is proportional to the amount of detuning of the filter. Thus, the error voltage of the output of 46 is a measure of the tuning error of the filter. Under such conditions the error signal into the integrator 50 will cause the integrator output (the tuning correction voltage) to change until it is the proper polarity and magnitude to retune the filter to the exact signal frequency, at which time the error signal returns to zero. The integrator will then maintain this correction voltage as long as it receives zero error input, and the filter remains tuned. As can be appreciated, the stability of the closed loop previously described depends on the total loop gain being limited in value. The rate of change of error voltage with respect to the filter tuning voltage $de_v/dV$ is a major contributor to the loop gain. As will be shown in the following derivation, $de_v/dV$ is dependent only on the signal amplitude and is independent of frequency. Thus, stable operation is assured over a very wide tuning range such as 1000 to 1 and for a limited range of signal amplitude such as 10 to 1.

The error voltage $e_v$ is given by $$e_v = K_1 \int_{-\frac{\pi}{2}}^{+\frac{\pi}{2}} \sin(\omega t - \theta) d(\omega t) \quad (1)$$

where:
$K_1$ is proportional to signal amplitude,
$\omega$ is radian frequency of the component of the signal passed by the filter, and
$\theta$ is the phase difference through the filter.

$$e_v = -K_1 \cos(\omega t - \theta) \Big|_{-\frac{\pi}{2}}^{\frac{\pi}{2}} \quad (2)$$

$$= -K_1 [\cos\omega t \cos\theta + \sin\omega t \sin\theta] \Big|_{-\frac{\pi}{2}}^{\frac{\pi}{2}} \quad (3)$$

$$= -K_1 \left[\sin\frac{\pi}{2} - \sin\left(-\frac{\pi}{2}\right)\right] \sin\theta \quad (4)$$

$$= -2K_1 \left[\sin\frac{\pi}{2}\right] \sin\theta = -2K_1 \sin\theta \quad (5)$$

For small errors, this is approximately given by $$e_v \approx -2K_1\theta \quad (6)$$

and the rate of change of $e_v$ with respect to $\theta$ is, therefore, $$de_v/d\theta = -2K_1 \quad (7)$$

The transfer function of the voltage tunable filter within the passband is approximately given by $$H(f) \approx 1/(1+2jQ\sigma) \quad (8)$$

where $$\sigma = (f-f_o)/f_o \quad (9)$$

and $$Q = \frac{f_o}{2(f-f_o)} \text{ when } H(f) = 0.707 \quad (10)$$

and $f_o$ is the frequency of resonance. The phase is given by $$\theta(f) \approx -\tan^{-1} 2Q\sigma \quad (11)$$

$$\approx -2Q\sigma = -2Q\left(\frac{f-f_o}{f_o}\right) \quad (12)$$

Thus, $$d\theta/df \approx -2Q/f_o \quad (13)$$

The frequency of the voltage tunable filter is given by $$f = f_{min} e^{KV} \quad (14)$$

thus, $$df/dV = Kf_{min}e^{KV} \quad (15)$$

Now, $de_v/dV$ is given by $$de_v/dV = d\theta/df \cdot df/dV \cdot de_v/d\theta \quad (16)$$

$$= -2Q/f_o \cdot Kf_{min}e^{KV} \cdot (-2K_1) \quad (17)$$

but at a given frequency $f_o, f_o = f_{min}e^{KV}$; and, therefore, $$\frac{de_v}{dV} = +\frac{4K_1K}{f_o} \cdot f_o \quad (18)$$

$$= 4K_1KQ$$

which is independent of operating frequency. From the above description, it is obvious that a synchronous filter is provided which automatically tracks the frequency of the incoming sine-wave signal by virtue of the control loop which acts to adjust the filter passband center frequency to equal the signal frequency. Further, the filter exhibits a constant Q characteristic and the servo-loop associated therewith exhibits a gain which is constant with frequency, tuning thereof being "log" or exponential in nature.

The arrangement of the invention as above described uniquely permits the utilization of digital readout devices as at 32 and 64 with the attendant advantages of enhanced accuracy, while accommodating for their otherwise distracting "rapid updating" characteristic. This feature stems from the select utilization of the summed tuning correction signal and primary tuning input voltage as developed at summing point 52. In utilizing the system, the operator initially elects either to provide a primary tuning signal from source 22 corresponding to a desired center frequency or to scan the frequency spectrum in search of amplitude peaks. Either procedure is carried out in conjunction with the closure of switch 60 to disable the loop or automatic tracking feature of the system. In effect, a "gross" form of readout then is achieved at devices 32 and 64. When an amplitude peak or generally desired center frequency is indicated at these respective readout components, switch 60 is opened, any error signal present is integrated to provide a tuning correction signal which is combined with the primary tuning voltage at summing point 52 and the progressively correcting tuning input at line 14 into filter 10 causes the latter to "seek" and find that frequency corresponding with that peak amplitude within the instant frequency region of interest as established by the initially selected primary tuning voltage. Thus, an automatic, "vernier" adjustment of filter 10 is provided which, in turn, provides a highly precise and stable frequency readout at digital device 64.

As is apparent, to achieve the foregoing performance, the error signal generated by the system is required to seek only that center frequency within a selected tuned bandwidth corresponding with peak amplitude. That such performance obtains may be demonstrated as follows:

A basic bandpass expression for filter 10 may be represented as:

$$\frac{E}{E_o} = \frac{S \frac{\omega_o}{Q}}{S^2 + S \frac{\omega_o}{Q} + \omega_o^2} \quad (19)$$

where
$E$ = the output voltage amplitude of the filter
$E_o$ = the output voltage amplitude of the filter at center frequency, fo
$\omega = 2\pi f$, where f is any frequency
$\omega_o = 2\pi fo$
S is an operator = $j\omega$
Q is resonance frequency divided by bandwidth.
Substituting for S:

$$\frac{E}{E_o} = \frac{j\omega \left(\frac{\omega_o}{Q}\right)}{-\omega^2 + j\omega \frac{\omega_o}{Q} + \omega_o^2} \quad (20)$$

$$= \frac{j\omega \left(\frac{\omega_o}{Q}\right)}{(\omega_o^2 - \omega^2) + j\omega \left(\frac{\omega_o}{Q}\right)} \quad (21)$$

$$= \frac{\omega \left(\frac{\omega_o}{Q}\right)}{\omega \left(\frac{\omega_o}{Q}\right) + 1/j(\omega_o^2 - \omega^2)} \quad (22)$$

$$= \frac{\omega \left(\frac{\omega_o}{Q}\right)}{\omega \left(\frac{\omega_o}{Q}\right) + j(\omega^2 - \omega_o^2)} \quad (23)$$

$$= \frac{1}{1 + j \frac{(\omega^2 - \omega_o^2)}{\omega \left(\frac{\omega_o}{Q}\right)}} \quad (24)$$

but, $\omega = \omega_o + \Delta\omega$, where $\Delta\omega$ is the deviation from center or resonance frequency $\omega_o$, and $(\omega^2 - \omega_o^2) = (\omega + \omega_o)(\omega - \omega_o)$, then:

$$\frac{E}{E_o} = \frac{1}{1 + j \frac{(2\omega_o + \Delta\omega)(\Delta\omega)Q}{\omega_o(\omega_o + \Delta\omega)}} \quad (25)$$

ps Where $\Delta\omega$ is much smaller than $\omega_o$, the following approximation may be made:

$$\frac{E}{E_o} \approx \frac{1}{1 + j \frac{2Q \Delta\omega}{\omega_o}} \quad (26)$$

It also may be observed from equation (27) that the phase angle, $\theta$, will approach zero at resonant frequency, i.e.

$$\theta = -\tan^{-1} \frac{\omega^2 - \omega_o^2}{\omega \left(\frac{\omega_o}{Q}\right)} \quad (27)$$

Thus, with the opening of switch 60, that center frequency representing peak amplitude automatically will be derived for accurate and stable readout at component 64. As shown at expression (26), maximum amplitude is present when $E/E_o$ equals unity, which condition obtains when $\Delta\omega$ equals zero.

Another of the above-noted aspects of the system resides in the utilization of a voltage tuned filter 10 wherein the passband center frequency thereof is selected as an exponential function of the tuning input voltage asserted at line 14. Thus, a voltage scan or excursion emanating from source 22 may, for example, tune filter 10 over three decades of frequency commencing in the audio region (e.g. 10 Hertz to 10 Kilohertz) without resort to band switching, resetting and other related requirements.

Although the invention has been shown in connection with a certain specific embodiment, it will be readily apparent to those skilled in the art that various changes in form and arrangement of parts may be made to suit requirements without departing from the spirit and scope of the invention.

I claim:

1. A system for carrying out the vibrational analysis of apparatus having a dynamic characteristic comprising:
    input means for receiving an a.c. input signal corresponding with said dynamic characteristic;
    a voltage-tunable filter of a variety wherein the passband center frequency thereof is selectible as an exponential function of a tuning input voltage applied at a tuning input thereof, said filter receiving said a.c. input and providing a filtered signal at an output;
    amplitude readout means coupled with said filter output for providing a visible indication of the instantaneous amplitude of said filtered signal;
    manually actuable voltage source means for providing a manually selectable primary tuning input voltage assertable at said filter tuning input;
    detector means for comparing the phase of said input signal with the phase of said filtered signal to derive an error signal corresponding with a phase difference therebetween;
    integrator means for treating said error signal to provide a tuning correction signal;
    summing means coupled with said filter tuning input and said integrator means for summing said tuning correction signal and said primary tuning input voltage; and manually actuable switch means for selectively effecting the assertion of said tuning correction signal at said summing means such that the magnitude of said error signal is minimized and the magnitude of said filtered signal is maximized.

2. The system of claim 1 in which said manually actuable switch means is actuable between a first condition wherein only said primary tuning input voltage is assertable at said voltage-tunable filter and a second condition wherein both said tuning correction signal and said primary tuning input voltage are asserted at said summing means.

3. The system of claim 2 including frequency readout means for providing a digital readout of the substantially instantaneous frequency corresponding with the said tuning input voltage applied at said filter tuning input.

4. The system of claim 1 in which said amplitude readout means is configured to provide said visible indication in digital format.

5. The system of claim 1 in which said manually actuable voltage source means is configured for deriving said primary tuning input voltage as exhibiting a magnitude corresponding with a predetermined passband center frequency of said voltage-tunable filter.

6. The system of claim 5 in which said manually actuable voltage source means is actuable to effect the assertion of said primary tuning input voltage as uniformly progressively varying voltage magnitudes.

7. The system of claim 1 wherein said voltage-tunable filter is configured for exhibiting a zero phase shift between said input signal and said filtered signal when said passband center frequency corresponds with a said input signal of maximum amplitude.

8. The system of claim 1 in which
said manually actuable voltage source means and said detector means are mutually coupled with said summing means; and
including frequency readout means coupled with said summing means for providing a digital readout of the substantially instantaneous frequency corresponding with said summed tuning correction signal and said primary tuning input voltage.

9. The system of claim 8 in which said manually actuable switch means is actuable between a first condition effecting the suppression of said error signal and a second condition permitting said summation of said error signal and said primary tuning input voltage.

10. The system of claim 1 in which said detector means includes means for shifting the phase of said filtered signal by 90°, means for converting the phase-shifted signal into a square-wave signal, and means for comparing said square-wave signal with said input signal to derive said error signal.

11. The system of claim 1 in which said manually actuable switch means is coupled within an electrical path selectively shunting said integrator means.

12. The system of claim 10 wherein the means for comparing said square-wave signal with the input signal to the filter comprises an operational amplifier having two input terminals, inverting and non-inverting, means for applying said input signal to both of said input terminals, and means for applying a short to ground in synchronism with said square-wave signal to only one of said input terminals.

13. The system of claim 12 where said synchronous short to ground is derived from a field-effect analog switch having source, drain and gate electrodes, one of said source and drain electrodes being grounded and the other being connected to said one of the input terminals of said operational amplifiers, said gate electrode being connected to said square-wave converter.

14. The system of claim 12 including a resistive feedback path between the output terminal and inverting one of said input terminals of said operational amplifier.

15. The system of claim 8 wherein said integrator means comprises an amplification stage having an input resistor and a feedback path including an integrating capacitor and stabilizing resistor coupled in series circuit relationship therewith.

* * * * *